US007800968B2

United States Patent
Kern

(10) Patent No.: US 7,800,968 B2
(45) Date of Patent: Sep. 21, 2010

(54) SYMMETRIC DIFFERENTIAL CURRENT SENSE AMPLIFIER

(75) Inventor: Thomas Kern, München (DE)

(73) Assignee: Infineon Technologies AG, Munich (DE)

( * ) Notice: Subject to any disclaimer, the term of this patent is extended or adjusted under 35 U.S.C. 154(b) by 9 days.

(21) Appl. No.: 11/743,407

(22) Filed: May 2, 2007

(65) Prior Publication Data
US 2008/0273394 A1 Nov. 6, 2008

(51) Int. Cl.
*G11C 7/02* (2006.01)
(52) U.S. Cl. .................. 365/207; 365/203; 365/185.21; 365/185.2; 365/208
(58) Field of Classification Search ................. 365/207, 365/185.21, 185.2, 208, 203; 330/257
See application file for complete search history.

(56) References Cited

U.S. PATENT DOCUMENTS

| 4,713,797 | A | * | 12/1987 | Morton et al. | 365/185.21 |
|---|---|---|---|---|---|
| 5,712,815 | A | * | 1/1998 | Bill et al. | 365/185.03 |
| 5,999,454 | A | | 12/1999 | Smith | |
| 6,044,019 | A | * | 3/2000 | Cernea et al. | 365/185.21 |
| 6,272,049 | B1 | | 8/2001 | Maruyama et al. | 365/185.24 |
| 6,310,809 | B1 | * | 10/2001 | Roohparvar et al. | 365/203 |
| 6,411,557 | B2 | | 6/2002 | Terzioglu et al. | |
| 6,535,434 | B2 | * | 3/2003 | Maayan et al. | 365/189.07 |
| 6,707,717 | B2 | * | 3/2004 | Jun-Lin | 365/185.21 |
| 6,813,209 | B2 | * | 11/2004 | Crain et al. | 365/208 |
| 7,088,630 | B2 | | 8/2006 | Hung et al. | |
| 2003/0169622 | A1 | * | 9/2003 | Ooishi et al. | 365/185.21 |
| 2004/0120200 | A1 | * | 6/2004 | Gogl et al. | 365/210.208 |
| 2004/0136255 | A1 | | 7/2004 | Crain et al. | |
| 2005/0036395 | A1 | * | 2/2005 | Maejima et al. | 365/232 |
| 2006/0126389 | A1 | * | 6/2006 | Sarig | 365/185.21 |
| 2009/0059672 | A1 | | 3/2009 | Kern | |

FOREIGN PATENT DOCUMENTS

WO   WO 2004034440   4/2004

OTHER PUBLICATIONS

Office Action dated Jul. 23, 2009 issued to Patent Publication No. 20090059672.
Response to Office Action dated Jul. 23, 2009 issued to Patent Publication No. 20090059672.
Notice of Allowance dated Dec. 16, 2009 issued to Patent Publication No. 20090059672.
Notice of Allowance dated Apr. 19, 2010 issued to Patent Publication No. 20090059672.

* cited by examiner

*Primary Examiner*—Pho M Luu
*Assistant Examiner*—Tha-o Bui
(74) *Attorney, Agent, or Firm*—Eschweiler & Associates, LLC

(57) ABSTRACT

A reference current integrator and a sensed current integrator are coupled to form a differential sense amplifier. The differential sense amplifier is coupled to receive a bitline current signal from a flash memory, and the reference current integrator is coupled to receive a current signal from a reference memory cell. The differential current integrating sense amplifier is also used for instrumentation, communication, data storage, sensing, biomedical device, and analog to digital conversion.

11 Claims, 4 Drawing Sheets

SYMMETRIC DIFFERENTIAL CURRENT SENSE AMPLIFIER

FIELD OF THE INVENTION

The invention relates generally to electronic amplifier circuits, and more specifically in one embodiment to a symmetric differential current sense amplifier.

BACKGROUND

Memory cells in computers and other electronic devices typically store information by storing a charge in a transistor or other circuit or component, such that the cell can be read by examining the charge in the cell. Traditional dynamic random access memory is arranged in rows and columns of memory cells that use a transistor and a capacitor at each memory cell location, such that the transistor is used to selectively charge the capacitor and store data. Reading data comprises selecting a column using a column access signal and reading the charge present in each cell in a selected row of capacitive memory cells.

While dynamic memory loses its data when it is powered off, nonvolatile memory such as flash memory retains its data once programmed. Flash memory comprises a number of independent cells, each of which typically comprises a single transistor and stores a single binary digit or bit of information. In variations, multiple transistors or multiple bits of information per cell are used. A typical flash memory or nonvolatile memory cell resembles a field effect transistor, but has an electrically isolated floating gate that controls or influences electrical conduction between source and drain regions of the memory cell. Data is represented by a charge stored on the floating gate, and the resulting conductivity observed between the source and drain regions during a read operation as a result of a change in the cell's threshold voltage.

The floating gate separates a second gate from the source and drain regions of the memory cell, which is called the control gate. Electrons stored on the floating gate insulated from the control gate and the drain and source by an insulating oxide layer partially cancel out or modify an electric field produced by the control gate, resulting in a change in the effective threshold voltage (Vt) of the memory cell. When the memory cell is read by placing a specified voltage on the control gate, current will either flow or not flow between the source and drain of the device, depending on the presence of a charge on the floating gate and the effective Vt or threshold voltage of the memory cell. The presence or absence of current above a threshold level is sensed in a sense amplifier, and is used to determine the state of the memory cell, resulting in a one or zero value being read.

But, as memory cells become increasingly smaller and the speed with which they operate becomes increasingly faster, factors such as capacitance can cause the observed difference in current flow between a flash memory cell with a charged floating gate and a flash memory cell with an uncharged floating gate to be very small. The decreased cell current at higher densities and larger capacitive loads on the bitline in particular can make it difficult to determine a memory cell's state. Sense amplifiers can have a difficult time detecting currents that are in the microamp range, especially in applications that operate at high speeds, low voltages and currents, and using very small semiconductor device sizes.

DETAILED DESCRIPTION

In the following detailed description of example embodiments of the invention, reference is made to specific example embodiments of the invention by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention. Features or limitations of various embodiments of the invention described herein, however essential to the example embodiments in which they are incorporated, do not limit other embodiments of the invention or the invention as a whole, and any reference to the invention, its elements, operation, and application do not limit the invention as a whole but serve only to define these example embodiments. The following detailed description does not, therefore, limit the scope of the invention, which is defined only by the appended claims.

Figure 1:
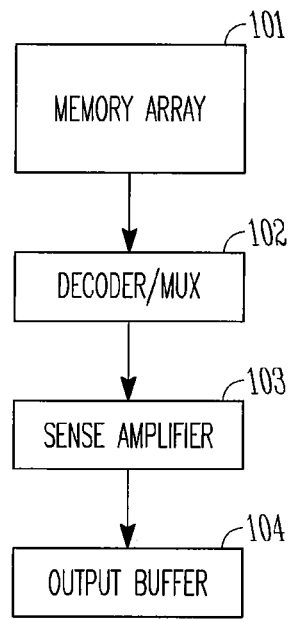
FIG. 1 illustrates a block diagram of a memory device, as may be used to practice various embodiments of the invention.

FIG. 1 is a block diagram of a flash memory, as may be used to practice some embodiments of the invention. The memory includes an array of flash memory elements at 101, which is accessed via a decoder/multiplexer 102 and coupled to a sense amplifier 103 and an output buffer or latch 104. In operation, the flash memory elements are selected by coupling the elements being read to bitlines via the decoder/multiplexer 102, which are in turn coupled to the sense amplifier 103. The sensed state of each bit being read is then latched or buffered in the output buffer 104.

Figure 2:
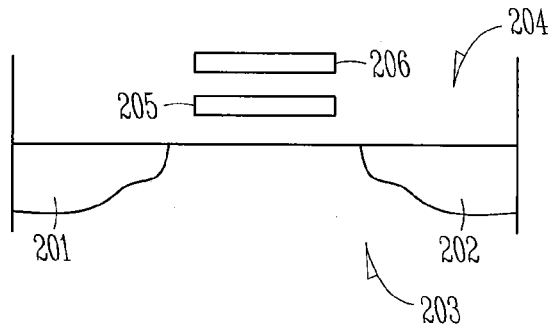
FIG. 2 illustrates a flash memory cell, as may be used to practice various embodiments of the invention.

A typical flash memory cell is illustrated in FIG. 2. A source 201 and drain 202 are formed on a substrate 203, where the substrate is made of a p-type semiconductor material. The source, drain, and substrate are in some embodiments formed of silicon, with a dopant having five valence electrons such as phosphorous, arsenic, or antimony to increase the electron concentration in the silicon or with a dopant having three valence electrons such as boron, gallium, indium, or aluminum to increase the hole concentration. Dopants are added in small, controlled quantities to produce the desired hole or electron concentration in the semiconductor material, resulting in n-type material if a surplus of electrons are present, such as in the source 201 and drain 202, and resulting on p-type material if an excess of holes are present such as in the substrate material 203.

An insulator material such as silicon oxide (SiO2) is used to form an insulating layer 204, which has embedded within it a floating gate 205, fabricated from a conductor such as metal or polysilicon, and a control gate 206 similarly formed of a conductive material. In some embodiments, the oxide 204 separating the floating gate 205 from the substrate material 203 is a high-quality oxide grown separately from the rest of the oxide 204. The floating gate is not directly electrically coupled to another conductive element of the memory cell, but is "floating" in the insulating material 204. The floating gate is separated from the region of the p-type substrate material 203 between the source 201 and the drain 202 by a thin insulating layer of controlled thickness, such as one hundred angstroms.

In operation, the floating gate 205 is able to store a charge due to its electrical isolation from other components of the memory cell. Setting or erasing a charge level on the floating gate 205 is performed in some embodiments such as NAND memory arrays via a tunneling process known as Fowler-Nordheim tunneling, in which electrons tunnel through the oxide layer separating the floating gate 205 from the substrate 203. In other example such as a NOR flash array, charging the floating gate is performed via a channel hot electron (CHE) method in which high voltage is applied between the gate and drain to increase the energy of the electrons that pass through the channel. Most flash memory cells are categorized as NOR flash or NAND flash, based on the circuitry used to perform write, read, and erase operations.

To write a bit to a NOR flash memory cell or store a charge on its floating gate using the channel hot electron method, the source 201 is grounded and a supply voltage such as six volts is applied to the drain 202, creating a pinch-off condition at the drain side of the substrate channel 203. In one embodiment, the drain voltage is applied via a bitline used to identify the bit to be written. A higher voltage such as 12 volts is also placed on the control gate 206, forcing an inversion region to form in the p-type substrate due to the attraction of electrons to the positively charged control gate. The voltage difference between the source and drain in combination with the inversion region in the p-type material result in significant electron flow between the source 201 and drain 202 through the p-type substrate 203's inversion region, such that the kinetic energy of the electrons and the electric field generated by the control gate voltage at 206 result in transfer of high-energy or "hot" electrons across the insulator and onto the floating gate 205. The current that flows between the source and drain is proportional to the number of electrons that become "hot", such that the number of "hot" electrons is the product of the current flow and the hot electron efficiency of the gate.

NOR and NAND flash memory can also be written and erased via Fowler-Nordheim tunneling. In one example of programming a cell via Fowler-Nordheim tunneling, the source 201 and drain 202 are grounded while the control gate is brought up to a high voltage of perhaps 20 volts. This higher gate voltage is needed in the absence of "hot" electrons flowing between the source and drain of the memory cell to cause tunneling of electrons from the substrate channel 203 or the source or drain through the insulator 204 onto the floating gate 205. The electrons that tunnel through the insulating oxide region via this Fowler-Nordheim (F-N) mechanism result in a negative electric field in the vicinity of the floating gate.

The floating gate thereby adopts a negative charge that counteracts any control gate positive charge's effect on the region of the substrate 203 between the source 201 and drain 202, raising the memory cell's threshold voltage that must be applied to the wordline to result in conduction across an inversion region in the p-type substrate material 203. In other words, when the wordline's voltage is brought to a logic 1 or high voltage such as five volts during a read operation, the cell will not turn on due to the higher threshold voltage as a result of electrons stored on the floating gate 205 during the write operation. The read voltage applied to the control gate is larger than the threshold voltage (Vt) of an erased memory cell, but not large enough to allow conduction across a substrate 203 inversion region of a cell that has been written.

Figure 3:
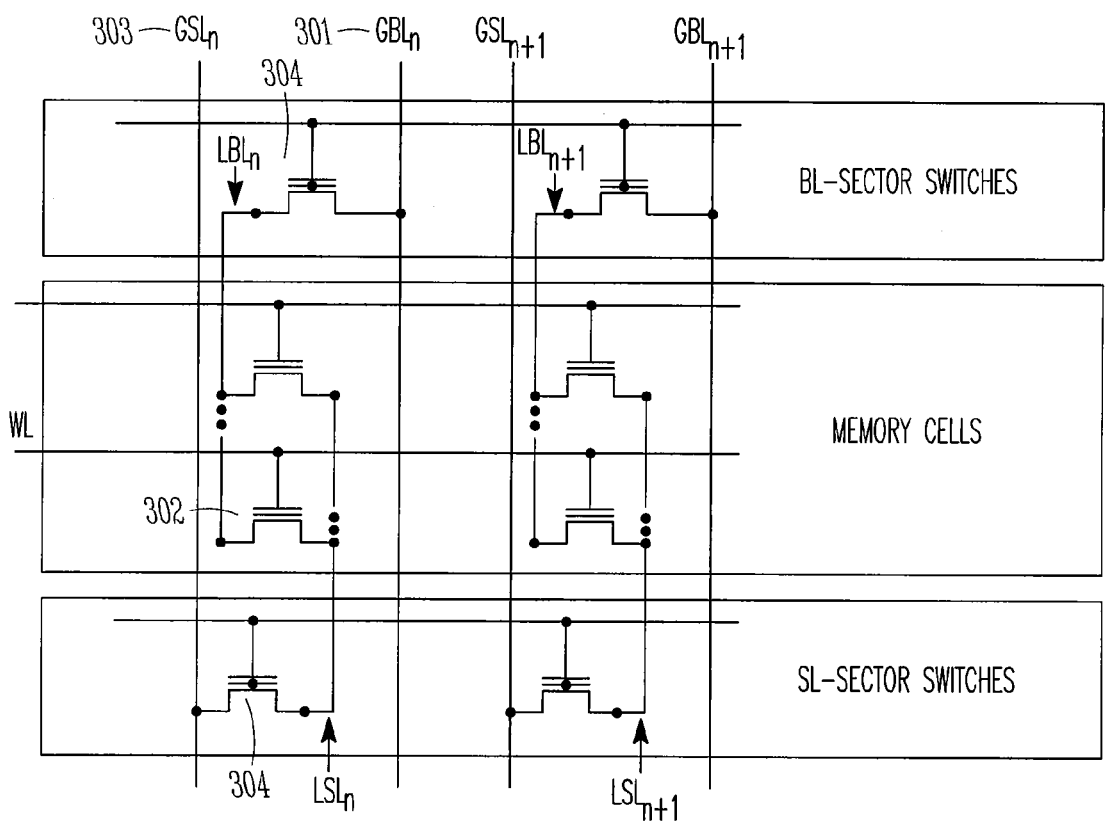
FIG. 3 is a schematic diagram of a portion of a flash memory array, as may be used to practice various embodiments of the invention.

Memory cells such as that of FIG. 2 are typically arranged in arrays that are addressed via wordlines and bitlines, as shown in FIG. 3. FIG. 3 shows a portion of an AND flash memory array, where each of the memory cells shown is addressable via a bitline and a wordline.

The bitline 301 is coupled to a series of floating gate memory cells 302, such as a parallel string of 32 memory cells. The series of memory cells are connected on the other side of the series to source line 303, and can be selectively isolated from the source line 303 and bitline 301 by line select transistors 304.

The memory cells are written in one example by providing appropriate voltages on the source and bit lines of the row of the cell to be programmed, and by applying the appropriate voltage to the wordline of the cell to be programmed. To perform a read operation, the wordline of the selected cell is brought high while a sense amplifier checks for conduction of a signal across the source and bitlines of the parallel string of cells including the cell selected via the wordline. In one more detailed example, a voltage applied at the source line is conducted to the wordline upon application of a read voltage to the wordline of the cell being read only if the cell is not programmed.

The sense amplifier 103 of FIG. 1 comprises in one embodiment a number of separate amplifiers coupled to the various bitlines of a memory array such as that of FIG. 3, such that the individual sense amplifier elements are used to amplify the current flow that can be observed on the bitlines. When the flash memory is operating at low voltages, high speed, and using very small cell geometry, the current flowing can be relatively small, and the current flow difference between a programmed and an unprogrammed flash memory cell can be difficult to detect.

Figure 4:
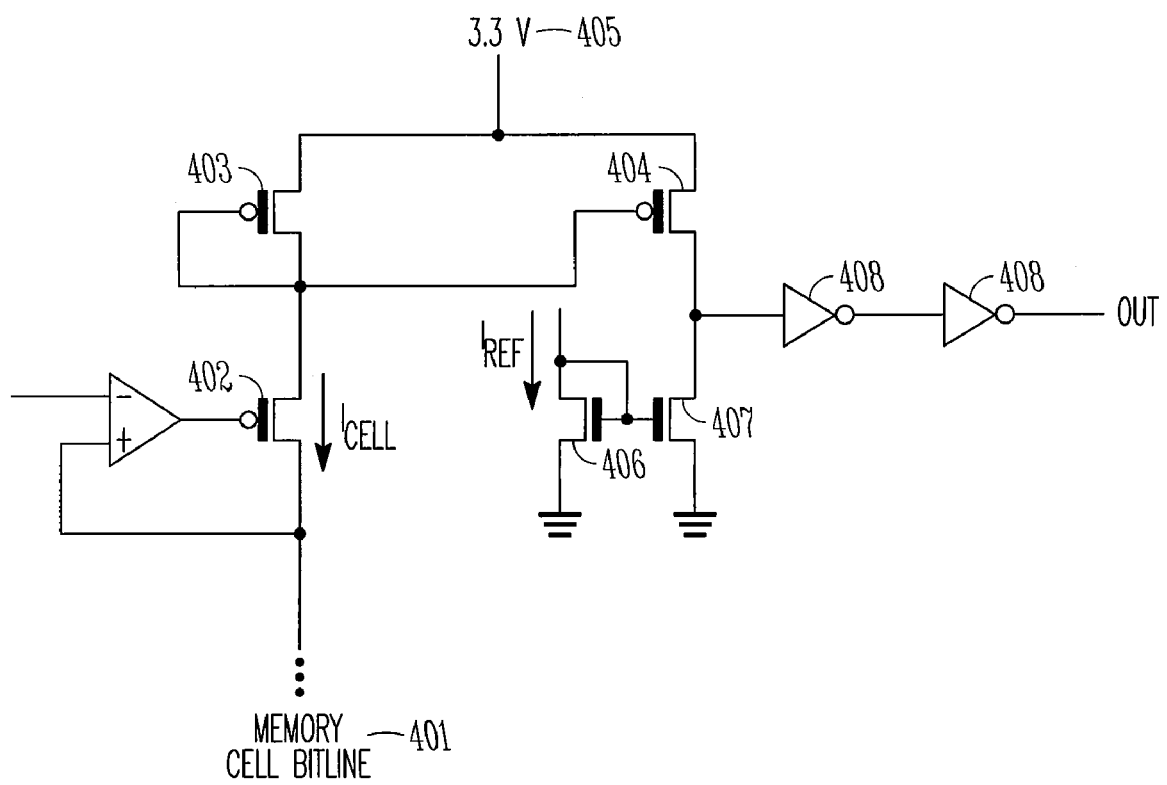
FIG. 4 is a schematic diagram of a sense amplifier, consistent with the prior art.

FIG. 4 shows a sense amplifier circuit, consistent with the prior art. The current flowing in the bitline is coupled to the circuit at 401, and draws current down through transistor 402. Transistors 403 and 404 are coupled to a voltage supply 405, and form a current mirror. A reference cell current transistor 406 is coupled to a reference cell and mirrors the current of the reference cell, which conducts at the threshold between a programmed and unprogrammed flash memory cell. The difference between the mirrored reference current flowing through the reference cell current transistor 407 and the mirrored current flowing through the transistor 404 determines the input and state of inverters 408, which are used to convert the input level to a digital value and buffer the value to produce an output signal.

The circuit node coupling transistors 404 and 406 to inverter 407 swings nearly rail-to-rail in operation, and therefore takes a relatively significant amount of time to change state. The time it takes this node to swing to its final state and settle to a stable voltage is not only dependent on the supply voltage, but also on the parasitic capacitance of the transistors 404 and 406, the wiring, and the transistors making up the inverter 407. The speed is also strongly influenced by the difference between the observed flash memory cell current and the reference transistor current, such that a halving of the observed current difference will result in a settling period that is twice as long.

The current difference is a significant factor in real world applications, and is the quantity that typically limits the ability of the circuit to determine whether the cell current is above or below the threshold reference current quickly. In a circuit such as the example in FIG. 4, a current difference of three microamps takes approximately four nanoseconds in extra delay to settle, due to the relatively small current difference. If the current difference drops to one microamp, the delay due to the low current alone is approximately fifteen nanoseconds.

In an embodiment where the overall access target time is approximately 20 nanoseconds as is typical in high performance flash memory devices, the delay due to the low current difference between the cell current and the reference or threshold current can account for up to 75% of the overall available access time. Even in a more typical application where there is a three microamp difference in current, 25% or more of the time allowed to perform the read is consumed by the circuit of FIG. 4 settling slowly as a result of the relatively low current difference.

Figure 5:
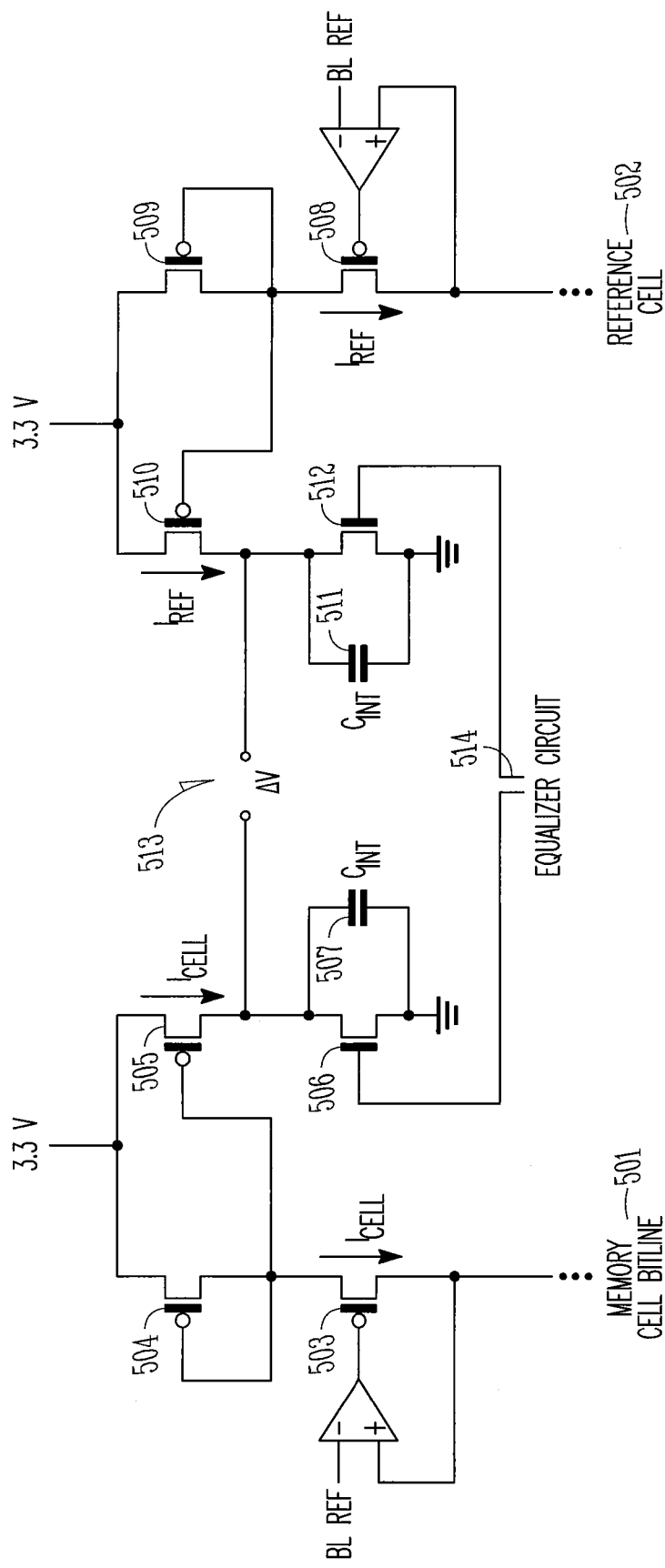
FIG. 5 is a schematic diagram of a differential integrating sense amplifier, consistent with an example embodiment of the invention.

FIG. 5 therefore provides a differential integrating sense amplifier topology that provides relatively fast settling times, even in the presence of very low current differentials. The circuit of FIG. 5 integrates the memory cell current observed on the bitline 501 in the left portion of the circuit, and integrates the current flowing through a reference cell 502 in the right portion of the circuit. Transistor 503 allows a current to flow based on the memory cell bitline value and the bitline reference (BLREF) signals input to an operational amplifier coupled to its gate. Transistors 504 and 505 form a current mirror, such that the bitline current flows through the transistor 505 as illustrated by Icell. Transistor 506 and capacitor 507 form an integrator, and store charge in capacitor 507 as the mirrored cell current flows through transistor 505.

On the right side of the schematic diagram, the reference cell 502 is configured to conduct at the threshold value between a programmed and an unprogrammed state, and sets the reference or threshold value for determining the state of other memory cells. The reference cell's current Iref is mirrored via the current mirror formed by transistors 508, 509, and 510, such that the reference cell's conducted current level is reflected in transistor 510. This current is also integrated in an integrator formed by capacitor 511 and transistor 512, such that the capacitor accumulates the current flowing as Iref through transistor 510. The capacitance of transistor 512 is part of the integrating capacitance, but is typically negligible relative to the capacitance of the integrating capacitor 511.

The difference between the reference current and the memory cell current becomes more evident over time in the circuit of FIG. 5, as the accumulated or integrated current signal stored as a voltage across the reference integrator capacitor 511 becomes increasingly larger or smaller than the integrated cell current mirrored through transistor 505 and stored in the memory cell current integrating capacitor 507. The accuracy of this process is dependent in part on having well matched transistors 506 and 512, matched integrating capacitors 507 and 511, and accurate comparison of the capacitor voltages at the differential voltage point 513. In one embodiment, an accurate, high-speed comparator is coupled between the memory cell current integrating circuit on the left side and the reference cell current integrating circuit on the right side, and its output reflects which of the two integrators has accumulated the larger voltage during integration.

Accuracy of the accumulated integration voltage is dependent not only on having very similar transistor and capacitor characteristics, but also on other factors such as equalization of the capacitor voltages before integration begins. This can be achieved in some embodiments via an equalizer circuit 514, operable to couple the capacitors to one another or to couple them so that the same potential is across each capacitor before integration begins. In one example embodiment, transistors 506 and 512 are turned on until integration begins, effectively coupling both terminals of both capacitors 507 and 511 to ground so that no charge is stored in the capacitors.

Capacitor characteristics such as equivalent series resistance and equivalent series inductance can also influence the response of the capacitor. Minimizing these parameters helps the capacitor receive a charge more efficiently, but matching these parameters between the two capacitors is perhaps more important in that it ensures the capacitors will charge at equal rates if exposed to the same circuit conditions. Other capacitor parameters such as dielectric absorption can be problematic to some degree in very sensitive applications, in that dielectric absorption causes a capacitor to retain some charge in its dielectric material even after the capacitor has been discharged. If capacitors 507 and 511 have significant dielectric absorption, the equalization or discharge process may not actually result in the capacitors both having no charge if one capacitor has retained some small charge due to dielectric absorption and the other capacitor has not.

Capacitors can also change capacitance, equivalent series resistance, or other characteristics as the temperature of the capacitor changes. Thermal change in capacitor characteristics is not uncommon in semiconductor devices as the semiconductor device operates and the substrate or die on which the circuit is formed heats up. Although a small change in characteristics may be tolerated if the change appears equally in both the reference capacitor 511 and the cell current capacitor 507, differences in characteristics between the capacitors is undesirable. The capacitors are therefore desirably built near each other, such as on the same integrated circuit or substrate, using the same semiconductor processes. Ensuring that the parameters of the capacitors are closely matched will result in being able to accurately accumulate current flow from the respective current mirrors of FIG. 5 very quickly, and result in a very fast useful result.

Figure 6:
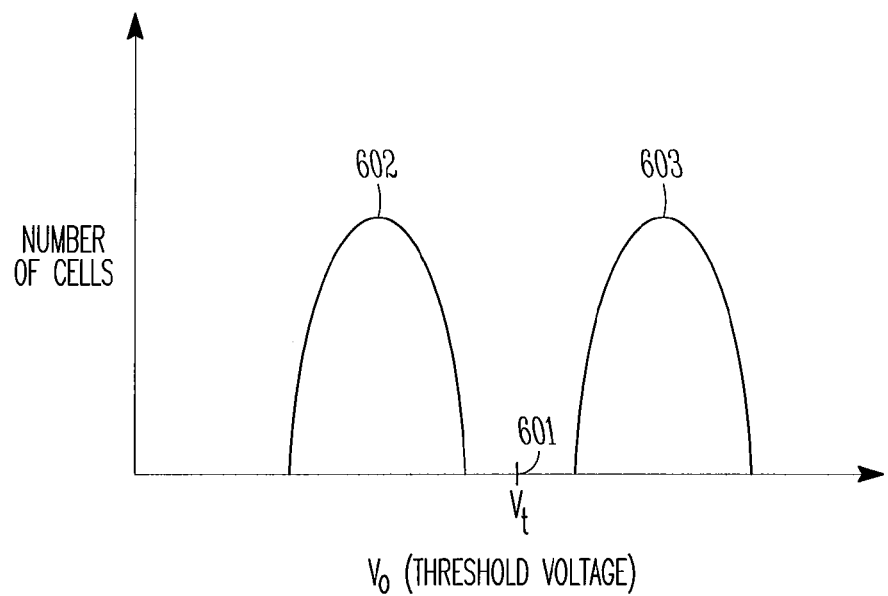
FIG. 6 is a graph illustrating the distribution in threshold voltages for programmed and unprogrammed memory cells and selection of a reference cell threshold voltage, consistent with an example embodiment of the invention.

Similarly, the characteristics of the reference cell are desirably similar to the characteristics of the memory cells in the flash memory array. In one example embodiment, the reference cell is a memory cell that is programmed to an intermediate or semi-programmed state, and defines the threshold above or below which other memory cells will be considered to be programmed or unprogrammed. An example distribution of threshold voltages is illustrated in FIG. 6, along with an example threshold voltage selected to provide reliable operation of the memory device. Here, the threshold voltage Vt for the reference cell shown at 601 is located between the threshold voltages for the erased cells as shown in the threshold distribution grouping at 602 and the programmed cells as shown in the threshold voltage distribution for programmed cells at 603.

Each of the threshold distribution regions 602 and 603 graphically shows the number of cells in a memory array that have a specific threshold voltage, such that the curves in effect show a probability distribution illustrating the probability of a particular cell in the memory array having a particular threshold voltage in the programmed and unprogrammed states. Because it is important to be able to distinguish a programmed memory cell from an unprogrammed memory cell, the gap between these distributions is desirably large enough to ensure reliable memory operation. The gap between the threshold for the programmed and unprogrammed distributions is in one embodiment in the range of two to three volts, and represents the difference between the erased or unprogrammed memory cell with the highest threshold voltage and the programmed memory cell with the lowest threshold voltage.

The threshold voltage of the reference cell is placed between these distributions as shown at 601, such that the threshold voltage of each of the memory cells when erased is lower than the threshold voltage 601, and the threshold voltage of each of the memory cells in a programmed state is higher than the threshold voltage of 601. The placement of the threshold voltage Vt of the reference cell 502 is in this example located midway between the erased memory cell threshold voltage distribution curve 602 and the programmed memory cell threshold voltage distribution curve 603, providing similar distinction between the reference cell threshold and the memory cell thresholds in their programmed and unprogrammed states. The threshold voltage Vt of the reference cell is set in one embodiment in manufacturing, such as by selecting a threshold as described above and programming the reference cell to have the selected Vt.

Figure 7:
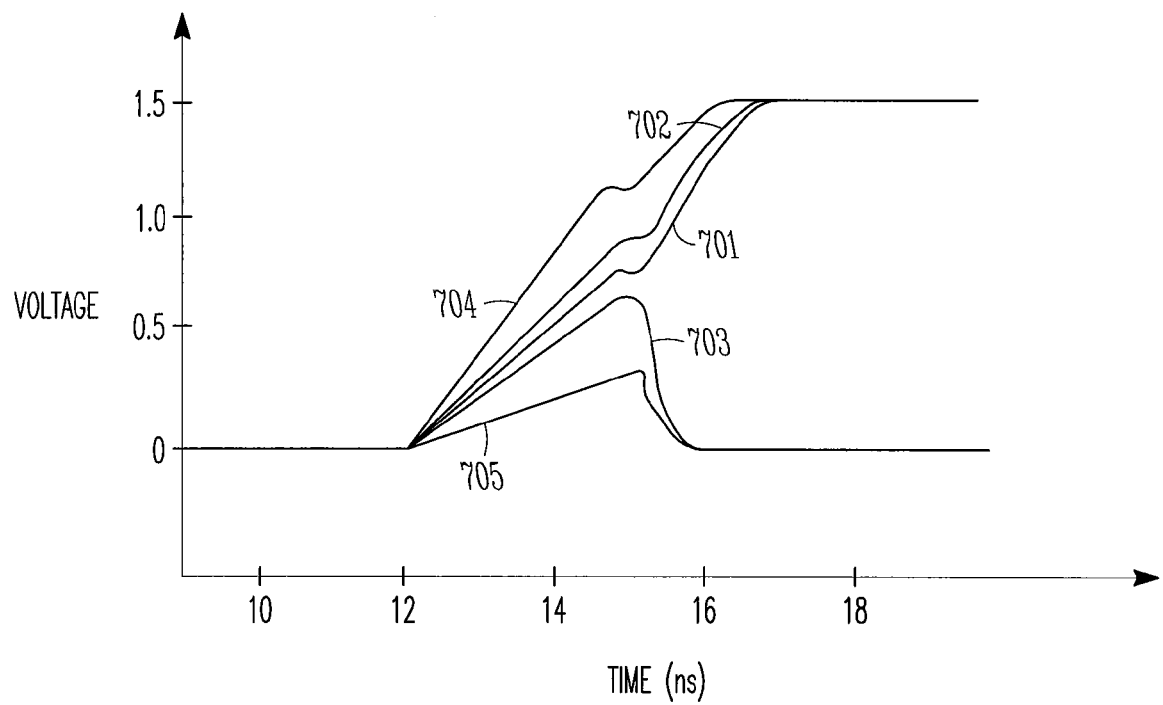
FIG. 7 illustrates the integrating capacitor voltage in response to the reference cell current Iref and various programmed and unprogrammed memory cell currents Icell, consistent with an example embodiment of the invention.

FIG. 7 illustrates the integrator capacitor voltage over time for a variety of example current differences relative to a reference cell current of ten microamps, consistent with an example embodiment of the invention. Curve 701 shows how the integrating capacitor 511 of FIG. 5 increases over time, as a current of approximately ten microamps flows through the reference cell and is mirrored by the current mirror as Iref In an embodiment where a difference of plus or minus one microamp is observed between a programmed cell and an unprogrammed cell relative to the reference cell, the difference in voltage accumulated in the reference integrating capacitor 511 and the programmed or unprogrammed cells will be increasingly evident over time, as shown by curves 702 and 703.

Curve 702 represents the voltage observed in the cell current integrating capacitor 507 at a memory cell bitline current of one microamp greater than the reference cell current, which is in this example a bitline current of 11 microamps relative to a reference cell current of ten microamps. The difference in accumulated voltage in the reference cell integrating capacitor 511 and the memory cell integrating capacitor 507 exceeds 50 mv after approximately three nanoseconds, at which point the difference between the voltages observed at 513 can be safely read as the state of the memory cell being read. Other examples use an accumulated voltage difference greater or smaller than 50 mv.

In another example in which the difference between the unprogrammed and programmed memory cell currents is plus or minus 7 microamps relative to the reference cell current of ten microamps, a usable output voltage difference of greater than the 50 mv desired in this example becomes available after only a fraction of a nanosecond. The voltage accumulated in the memory cell integrating capacitor when the memory cell is in a programmed state and conducting 17 microamps is shown in curve 704, and the voltage accumulated in the memory cell integrating capacitor when the memory cell is in an unprogrammed state and conducts only three microamps is shown in curve 705. Both of these curves diverge very quickly from the voltage seen across the integrating capacitor 511 receiving current mirrored from the reference cell 502's 10 microamp threshold current as shown at 701, enabling fast and accurate detection of the state of the memory cell.

Although the example differential integrating sense amplifier topology in FIG. 5 is used to sense the programmed state of a memory cell in a flash memory array, various other embodiments of the invention will apply similar embodiments of the invention to other applications, including other sensors or instrumentation devices, communications systems and data storage devices, biomedical devices and sensors, and high speed analog-to-digital converters.

Although specific embodiments have been illustrated and described herein, it will be appreciated by those of ordinary skill in the art that any arrangement that achieve the same purpose, structure, or function may be substituted for the specific embodiments shown. This application is intended to cover any adaptations or variations of the example embodiments of the invention described herein. It is intended that this invention be limited only by the claims, and the full scope of equivalents thereof.

The invention claimed is:

1. A differential sense amplifier assembly, comprising:
a first transconductance circuit configured to conduct a memory cell current based on a bitline voltage, wherein the memory cell current is indicative of a data state of the memory cell being read;
a first integration circuit configured to integrate the memory cell current or a first current associated therewith, and generate a first voltage at a first differential output terminal in response thereto;
a second transconductance circuit configured to conduct a reference cell current based on a reference bitline voltage, wherein the reference cell current is indicative of an intermediate data state of a reference memory cell being read;
a second integrator circuit configured to integrate the reference cell current or a second current associated therewith, and generate a second voltage at a second differential output terminal in response thereto;
an equalizer circuit configured to equalize voltages at the first and second differential output terminals prior to integration by the first and second integrator circuits,
wherein a differential voltage measured across the first and second differential output terminals is indicative of the data state of the memory cell being read.

2. The differential sense amplifier of claim 1, wherein the first transconductance circuit comprises:
a differential amplifier having a first input coupled to a memory cell bitline containing the bitline voltage, and a second input coupled to a bitline reference potential, and configured to output a control voltage based on a comparison of the bitline voltage and the bitline reference potential; and
a transistor connected to the memory cell bitline, and having a control terminal configured to receive the control voltage of the differential amplifier, wherein the transistor is configured to selectively conduct the memory cell current as a function of the control voltage.

3. The differential sense amplifier of claim 2, wherein the second transconductance circuit comprises:
a differential amplifier having a first input coupled to a reference cell bitline containing the reference cell bitline voltage, and a second input coupled to a reference bitline reference potential, and configured to output a control voltage based on a comparison of the reference cell bitline voltage and the reference bitline reference potential; and a transistor connected to the reference cell bitline, and having a control terminal configured to receive the control voltage of the differential amplifier, wherein the transistor is configured to selectively conduct the reference cell current as a function of the control voltage.

4. The differential sense amplifier of claim 3, further comprising:

a first current mirror circuit configured to generate the first current as a mirrored ratio of the memory cell current, and further configured to provide the first current to the first integrator circuit; and a second current mirror circuit configured to generate the second current as a mirrored ratio of the reference cell current, and further configured to provide the second current to the second integrator circuit.

5. The differential sense amplifier of claim 4, wherein the equalizer circuit comprises:

a first switching circuit coupled in parallel with the first integrator circuit;

a second switching circuit coupled in parallel with the second integrator circuit; and a control circuit configured to concurrently activate the first and second switching circuits and thereby equalize a voltage at the first and second differential output terminals prior to integration by the first and second integrator circuits.

6. The differential sense amplifier of claim 5, wherein the first and second switching circuits comprise transistors.

7. The differential sense amplifier of claim 6, wherein the first and second integrator circuits each comprise a capacitor.

8. The differential sense amplifier of claim 1, further comprising a reference memory cell operably coupled to a reference bitline, wherein the reference cell current is generated by the reference memory cell, wherein the reference memory cell is structurally substantially similar to the memory cell being read, and wherein the reference memory cell is programmed to the intermediate state.

9. The differential sense amplifier of claim 1, further comprising:

a first current mirror circuit configured to generate the first current as a mirrored ratio of the memory cell current, and further configured to provide the first current to the first integrator circuit; and a second current mirror circuit configured to generate the second current as a mirrored ratio of the reference cell current, and further configured to provide the second current to the second integrator circuit.

10. The differential sense amplifier of claim 1, wherein the equalizer circuit comprises:

a first switching circuit coupled in parallel with the first integrator circuit;

a second switching circuit coupled in parallel with the second integrator circuit; and a control circuit configured to concurrently activate the first and second switching circuits and thereby equalize a voltage at the first and second differential output terminals prior to integration by the first and second integrator circuits.

11. The differential sense amplifier of claim 1, wherein the first and second integrator circuits each comprise a capacitor.

* * * * *